(12) United States Patent
Chiu et al.

(10) Patent No.: US 12,305,434 B2
(45) Date of Patent: May 20, 2025

(54) LOCKING DEVICE AND CONTAINER USING THE SAME

(71) Applicant: GUDENG PRECISION INDUSTRIAL CO., LTD., New Taipei (TW)

(72) Inventors: Ming-Chien Chiu, New Taipei (TW); Zheng-Hong Huang, New Taipei (TW); Chia-Wei Chen, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 67 days.

(21) Appl. No.: 17/476,500

(22) Filed: Sep. 16, 2021

(65) Prior Publication Data

US 2022/0389741 A1 Dec. 8, 2022

Related U.S. Application Data

(60) Provisional application No. 63/196,701, filed on Jun. 4, 2021.

(51) Int. Cl.
*E05C 3/22* (2006.01)
*E05B 15/04* (2006.01)
(Continued)

(52) U.S. Cl.
CPC ............... *E05C 3/22* (2013.01); *E05B 15/04* (2013.01); *E05C 3/02* (2013.01); *E05C 19/006* (2013.01)

(58) Field of Classification Search
CPC . Y10T 292/08; Y10T 292/20; Y10T 292/202; Y10T 292/225; E05C 3/22;
(Continued)

(56) References Cited

U.S. PATENT DOCUMENTS

| 958,745 A | * | 5/1910 | Holtzhouser | .......... B65D 25/32 |
| | | | | 220/318 |
| 1,043,458 A | * | 11/1912 | O'Quinn | ................ B65D 35/42 |
| | | | | 220/322 |

(Continued)

FOREIGN PATENT DOCUMENTS

| CN | 104591034 A | * | 5/2015 | ............. A47B 88/43 |
| CN | 106275027 A | * | 1/2017 | ............... B62B 3/04 |

(Continued)

*Primary Examiner* — Kristina R Fulton
*Assistant Examiner* — Steven A Tullia

(57) ABSTRACT

A locking device is provided adjacent to a side opening of a container and includes a handle having a driving section and being pivotally turnably mounted to a top of the container; a long bar-shaped locking member having two opposite ends pivotally connected to the top and a bottom of the container to be turnable toward or away from the side opening; and a return spring mounted on the handle. The locking member includes an upper section located adjacent to the driving section. When the handle is pivotally turned from a horizontal to a vertical position relative to the top, the driving section is turned to drive the upper section for the locking member to pivotally turn toward the side opening. A container using the above locking device is disclosed. When the container is lifted at the handle, the locking member is driven to automatically lock the side opening.

8 Claims, 10 Drawing Sheets

(51) Int. Cl.
*E05C 3/02* (2006.01)
*E05C 19/00* (2006.01)

(58) Field of Classification Search
CPC ...... E05C 19/00; E05C 19/001; E05C 19/002;
E05C 19/003; E05C 19/12; E05C 19/14;
E05C 19/145; E05C 19/006; E05C 17/00;
E05C 17/02; E05C 17/04; E05C 17/045;
E05C 17/12; E05C 17/38; E05C 3/00;
E05C 3/004; E05C 3/006; E05C 3/008;
E05C 3/02; E05C 3/06; E05C 3/08; E05C
3/10; E05B 15/04; E05B 15/0086; E05B
65/006; E05B 65/0075; E05B 65/44;
E05B 65/52; E05B 65/5207; E05B
65/5246; E05B 65/5253; E05B 65/5269;
E05B 65/5276; E05B 63/18; E05B 17/20;
E05B 17/2015; E05B 17/203; E05B
17/2034; E05B 17/2049; E05B 17/2053;
B65D 45/00; B65D 45/02; B65D 45/025;
B65D 45/04; B65D 45/06; B65D 45/14;
B65D 45/16; B65D 45/20; B65D 45/24
USPC .............. 220/756, 760, 759, 752, 212.5
See application file for complete search history.

(56) References Cited

U.S. PATENT DOCUMENTS

| | | | | | |
|---|---|---|---|---|---|
| 1,358,380 | A * | 11/1920 | Loeber | ............... | B65F 1/1615 |
| | | | | | 292/303 |
| 1,720,429 | A * | 7/1929 | Nein | ................ | B60P 1/26 |
| | | | | | 296/51 |
| 4,067,444 | A * | 1/1978 | Wilson | ............... | B62B 3/006 |
| | | | | | 211/126.15 |
| 4,157,146 | A * | 6/1979 | Svenson | ............. | F16J 13/24 |
| | | | | | 292/257 |
| 4,632,446 | A * | 12/1986 | Douglass | ............ | E05B 65/0003 |
| | | | | | 292/205 |
| 4,790,610 | A * | 12/1988 | Welch | ................ | A61B 50/10 |
| | | | | | D24/185 |
| 5,064,236 | A * | 11/1991 | Stanfield | ............. | A47J 47/16 |
| | | | | | 211/49.1 |
| 5,452,795 | A * | 9/1995 | Gallagher | ............ | H01L 21/67369 |
| | | | | | 206/711 |
| 5,853,214 | A * | 12/1998 | Babbs | ................ | H01L 21/6734 |
| | | | | | 211/41.18 |
| 5,915,562 | A * | 6/1999 | Nyseth | ............... | H01L 21/67373 |
| | | | | | 414/217 |
| 5,960,959 | A * | 10/1999 | Wu | ..................... | H01L 21/67369 |
| | | | | | 206/454 |
| 6,053,545 | A * | 4/2000 | Asmundson | .......... | E05C 3/02 |
| | | | | | 292/210 |
| 6,385,050 | B1 * | 5/2002 | Orita | .................. | G11B 33/0438 |
| | | | | | 361/801 |
| 6,923,325 | B2 * | 8/2005 | Duban-Hu | ........ | H01L 21/67369 |
| | | | | | 206/711 |
| 7,086,540 | B2 * | 8/2006 | Huang | ................. | H01L 21/6734 |
| | | | | | 211/41.18 |
| 7,556,153 | B2 * | 7/2009 | Chiu | ................... | H01L 21/67369 |
| | | | | | 206/445 |
| 8,348,311 | B2 * | 1/2013 | Helms | .................. | E05B 83/01 |
| | | | | | 292/DIG. 30 |
| 8,556,359 | B1 * | 10/2013 | Gorgievski | .......... | E05B 65/0042 |
| | | | | | 312/405 |
| 8,807,608 | B2 * | 8/2014 | Schuler | ................ | B60K 1/04 |
| | | | | | 180/68.5 |
| 8,844,749 | B2 * | 9/2014 | Manahan | ............... | B65D 45/24 |
| | | | | | 220/325 |
| 8,905,239 | B2 * | 12/2014 | Kim | .................... | H01L 21/6735 |
| | | | | | 211/41.18 |
| 10,793,338 | B2 * | 10/2020 | Heap | .................... | B65G 69/20 |
| 11,158,530 | B1 * | 10/2021 | Wen | .................... | H01L 21/6734 |
| 2013/0256186 | A1 * | 10/2013 | Kim | .................... | H01L 21/6732 |
| | | | | | 206/711 |
| 2014/0069844 | A1 * | 3/2014 | Kida | .................... | H05K 7/1408 |
| | | | | | 206/707 |
| 2018/0228045 | A1 * | 8/2018 | Yi | ......................... | E05B 65/44 |
| 2018/0282043 | A1 * | 10/2018 | Heap | .................... | B65D 81/18 |
| 2022/0219868 | A1 * | 7/2022 | Zhu | .................... | B65D 51/248 |

FOREIGN PATENT DOCUMENTS

| | | | | |
|---|---|---|---|---|
| CN | 107452912 A | * | 12/2017 | ............. A47B 31/00 |
| CN | 107687296 A | * | 2/2018 | ............. B65D 19/38 |
| DE | 1029261 B | * | 5/1954 | ......... E05B 17/0025 |
| DE | 102006004823 A1 | * | 10/2006 | ......... E05B 17/0025 |
| DE | 102009048085 A1 | * | 4/2011 | ............. A47B 49/00 |
| TW | 201730060 A | * | 9/2017 | ............. A47B 31/00 |

* cited by examiner

LOCKING DEVICE AND CONTAINER USING THE SAME

CROSS-REFERENCE TO RELATED APPLICATION

This non-provisional application claims priority under 35 U.S.C. § 119(e) on U.S. provisional Patent Application Nos. 63/196,701 filed on Jun. 4, 2021, the entire contents of which are hereby incorporated by reference.

BACKGROUND OF THE INVENTION

1. Field of the Invention

The present disclosure relates to a locking device, and more particularly, to a locking device mounted on a container and driven to a locked position when a handle of the container is lifted; and the present disclosure also relates to a container using such locking device.

2. Description of the Related Art

Generally, a container for loading electronic component trays, wafer trays or various plate-shaped objects is symmetrically provided on two opposed inner wall surfaces with a plurality of horizontally extended receiving slots. These receiving slots are arranged on the two side wall surfaces in a vertical direction, and every plate-shaped object is flatly supported on two receiving slots that are located at the same height position.

After the plate-shaped objects are sequentially put into the container via a side opening thereof, an additional procedure is required to actuate a locking device to close the side opening manually or using an automated machine. This type of locking device has complicated structure and tends to damage after being used over a long time.

BRIEF SUMMARY OF THE INVENTION

An objective of the present disclosure is to solve the problems in the conventional container for plate-shaped objects by providing an improved locking device and a container using such locking device. The locking device is simultaneously activated to close a side opening of a container when a handle of the container is lifted, which avoids the objects loaded in the container from falling off via the side opening when the container is moved during transport.

To achieve at least the above objective, the locking device according to the present disclosure is provided adjacent to a side opening of a container main body and includes a handle, a locking member and a return spring. The handle is pivotally mounted to a top of the container main body and turnable between a horizontal position and a vertical position relative to the top; and the handle includes a driving section. The locking member is in the form of a long bar having two opposite ends pivotally connected to the top and a bottom of the container main body, such that the locking member is pivotally turnable toward or away from the side opening. The locking member includes an upper section located adjacent to the driving section. The return spring is mounted to the handle. Wherein, when the handle is pivotally turned from the horizontal position to the vertical position, the driving section is turned at the same time to drive the upper section for the locking member to pivotally turn toward the side opening.

In an embodiment, the locking member is in the form of a long bar with the upper section extending in a direction parallel to the top of the container main body. The driving section is located between the upper section and the top of the container main body.

In an embodiment, the locking device further includes a movement limiting member located within a movement range of the upper section and having a height higher than a lowest position of the upper section. The height of the movement limiting member becomes lower than the lowest position of the upper section to allow the locking member to pivotally turn toward the side opening when the handle is pivotally turned from the horizontal position to the vertical position.

In an embodiment, the movement limiting member is a protruded section provided on the handle and located within a movement range of the upper section. The protruded section is located at a height position higher than the lowest position of the upper section when the handle is located in the horizontal position; and the protruded section is located at another height position lower than the lowest position of the upper section to allow the locking member to pivotally turn toward the side opening when the handle is pivotally turned from the horizontal position to the vertical position.

In another embodiment, the movement limiting member is a guide block fixedly mounted on the top of the container main body and located below the upper section. The guide block includes an apex having a height higher than the lowest position of the upper section; and the driving section drives the upper section to pass over the apex when the handle is pivotally turned from the horizontal position to the vertical position.

In an embodiment, the locking device further includes an abutting section located near one side of the guide block. The abutting section and the guide block together define a limiting space between them, and the upper section is limited to be pivotally turnable only within the limiting space.

In an embodiment, the locking device further includes a handle turning angle limiter provided on the handle. The handle turning angle limiter limits the handle to pivotally turn relative to the top of the container main body within a range from zero to 120 degrees.

In an embodiment, the handle includes a grip section, a pivot section and the driving section, which are sequentially connected to one another. The pivot section is horizontally and pivotally connected to the top of the container main body, and the driving section is located near an outer side of the container main body and connected to the pivot section at a predetermined angle. The driving section is moved from the position near the outer side of the container main body toward the side opening when the handle is pivotally turned from the horizontal position to the vertical position.

In an embodiment, the locking device further includes a handle turning angle limiter provided at a joint of the grip section and the pivot section. The handle turning angle limiter is provided with a notch facing toward the grip section to limit an angle within which the grip section is allowed to pivotally turn relative to the top of the container main body.

To achieve at least the above objective, the container according to the present disclosure includes a container main body having at least one side opening and an above-described locking device.

The locking device and the container using the locking device according to the present disclosure are simple and compact in structure, durable for use, and easy to operate. In the present disclosure, the locking member automatically closes the side opening when the container is lifted at the handle. With this design, it is able to omit the additional procedure of manually or mechanically locking the container and avoid the objects loaded in the container from falling off during the transport of the container.

DETAILED DESCRIPTION OF THE INVENTION

To facilitate understanding of the objects, characteristics and effects of this present disclosure, embodiments together with the attached drawings for the detailed description of the present disclosure are provided. It is noted the present disclosure can be implemented or applied in other embodiments, and many changes and modifications in the described embodiments can be carried out without departing from the spirit of the disclosure, and it is also understood that the preferred embodiments are only illustrative and not intended to limit the present disclosure in any way.

Figure 1:
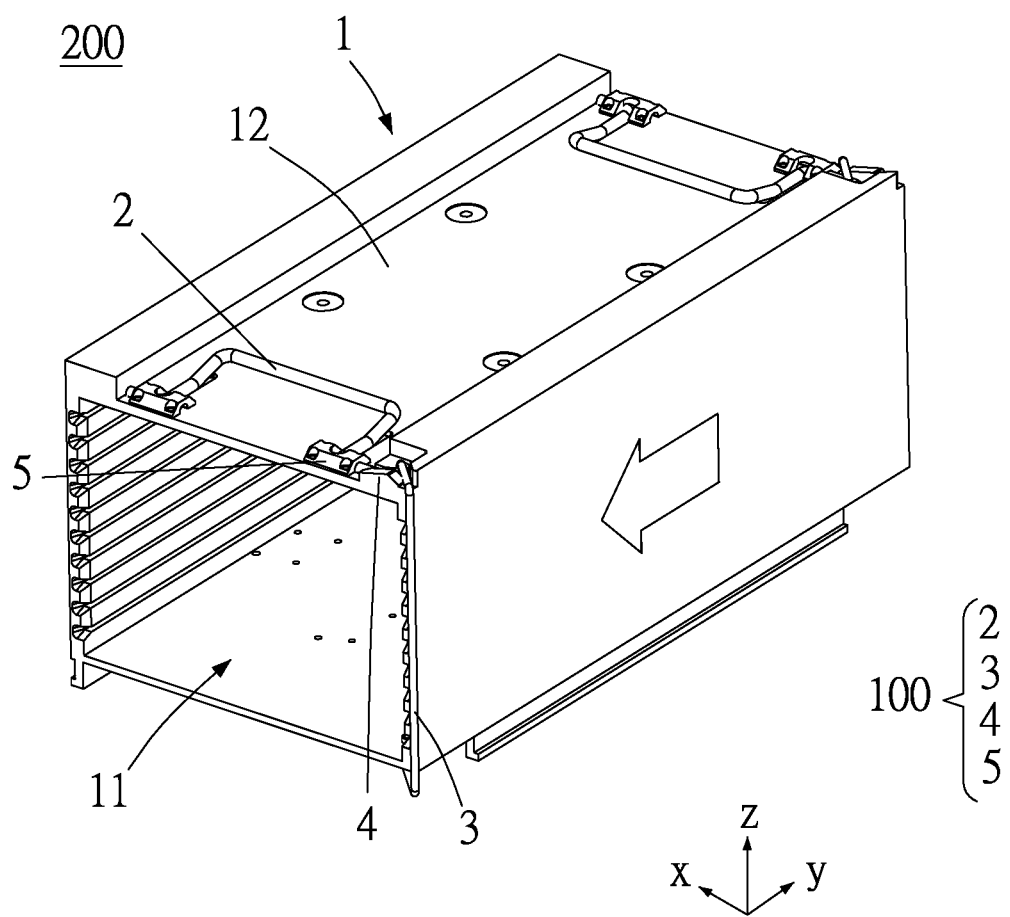
FIG. 1 is an assembled perspective view of a container using a locking device according to a first embodiment of the present disclosure.
Figure 2:
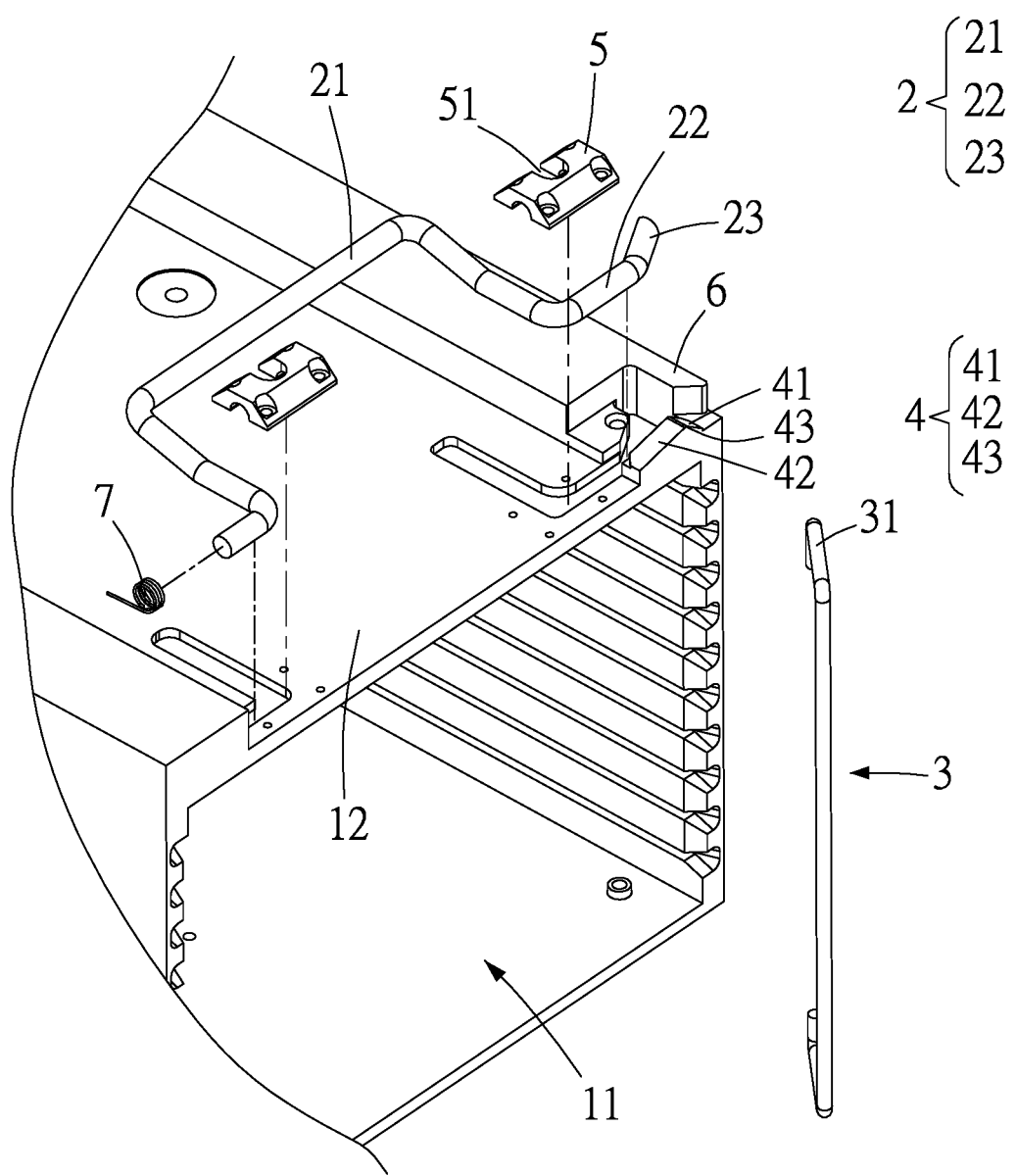
FIG. 2 is a fragmentary exploded perspective view of the container using a locking device according to the first embodiment of the present disclosure.

Please refer to FIGS. 1 and 2. A container 200 according to a first embodiment of the present disclosure includes a container main body 1 and a locking device 100.

The container main body 1 includes at least one side opening 11 and a top 12 and is non-restrictively used to receive a plurality of plate-shaped objects therein (not shown).

The locking device 100 is located adjacent to the side opening 11 and includes a handle 2, a locking member 3 and a return spring 7.

The handle 2 is connected to the top 12 of the container main body 1 and is pivotally turnable relative to the top 12, and the handle 2 includes a driving section 23.

The locking member 3 is in the form of a long bar and is pivotally connected at an end to the top 12 of the container main body 1 and at another end to a bottom of the main body 1 located opposite to the top 12, so that the locking member 3 is pivotally turnable toward or away from the side opening 11. The locking member 3 has an upper section 31 located adjacent to the driving section 23.

Figure 3:
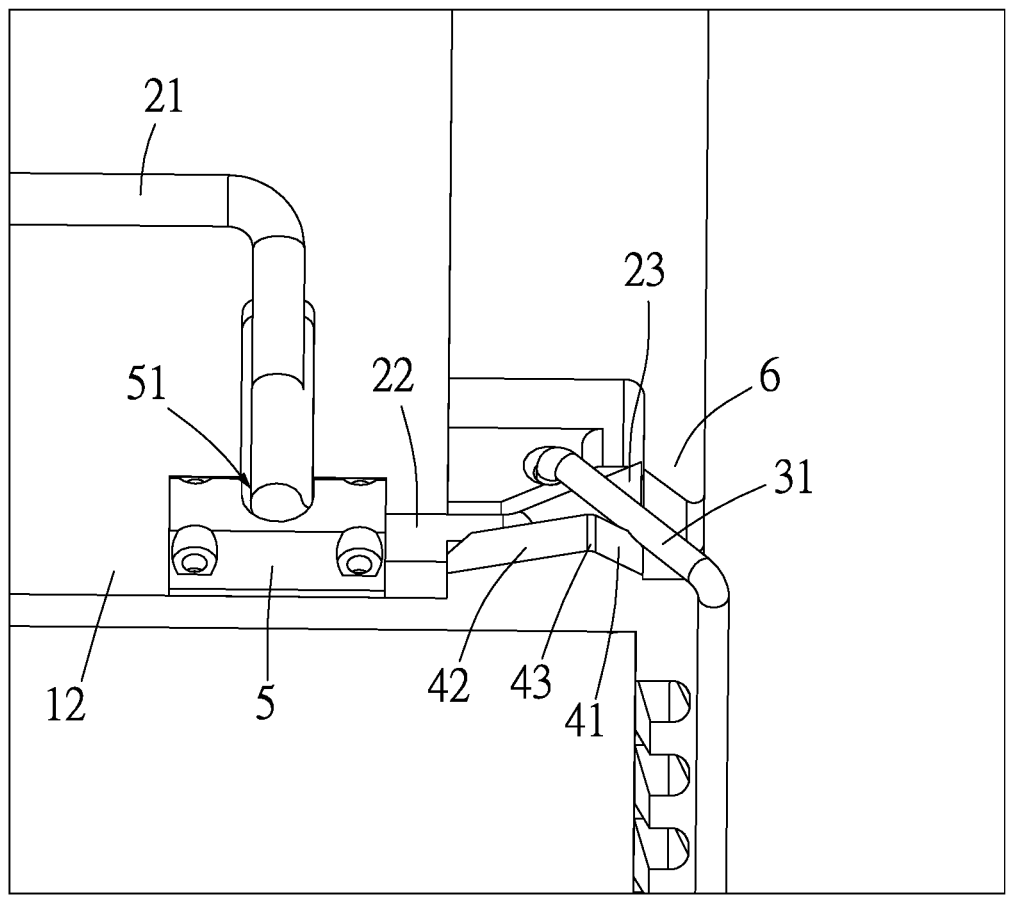
FIG. 3 is a partial enlarged view of the container in FIG. 1 with the locking device in an unlocked position.

The handle 2 can be pivotally turned manually or by an automated machine. As shown in FIG. 3, the handle 2 is flatly or closely laid on the top 12 of the container main body 1. That is, the handle 2 is normally located horizontally. When the handle 2 is located horizontally and the locking member 3 has not been driven into a locked state, the locking member 3 is located outside the side opening 11 or at a non-restricted position and does not stop the objects from being moved in or out via the side opening 11.

Figure 4:
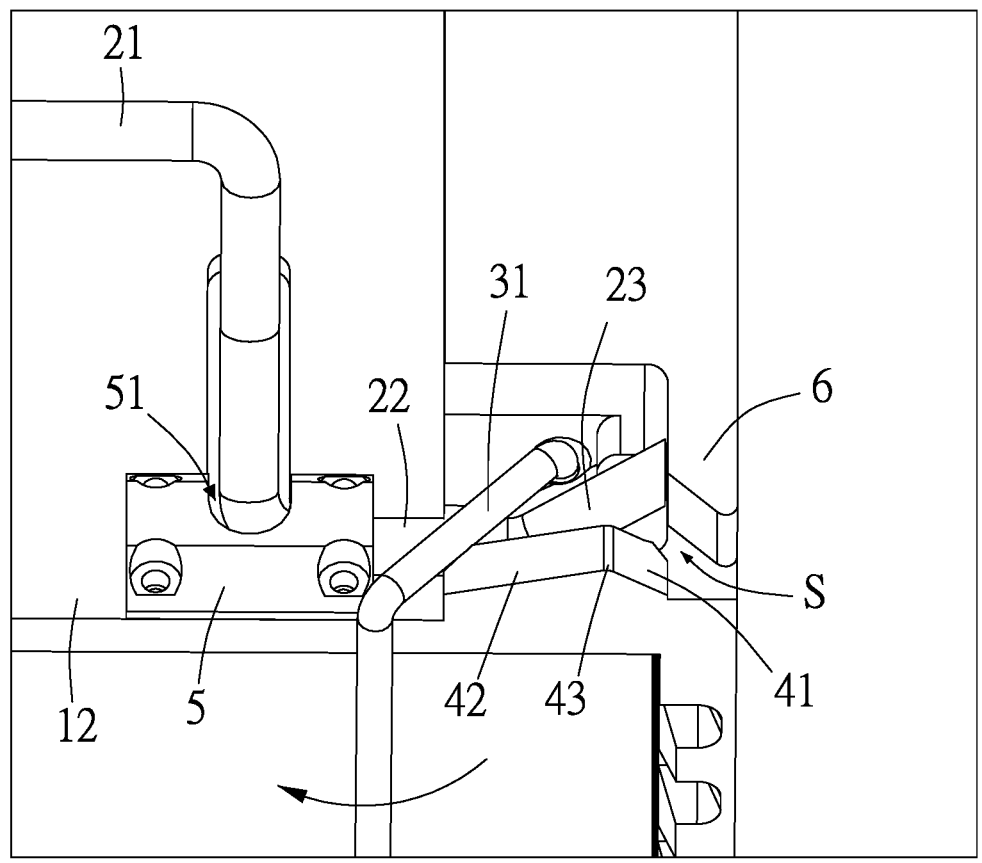
FIG. 4 is a partial enlarged view of the container in FIG. 1 with the locking device in a locked position.
Figure 4:
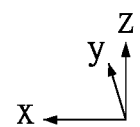
Figure 5:
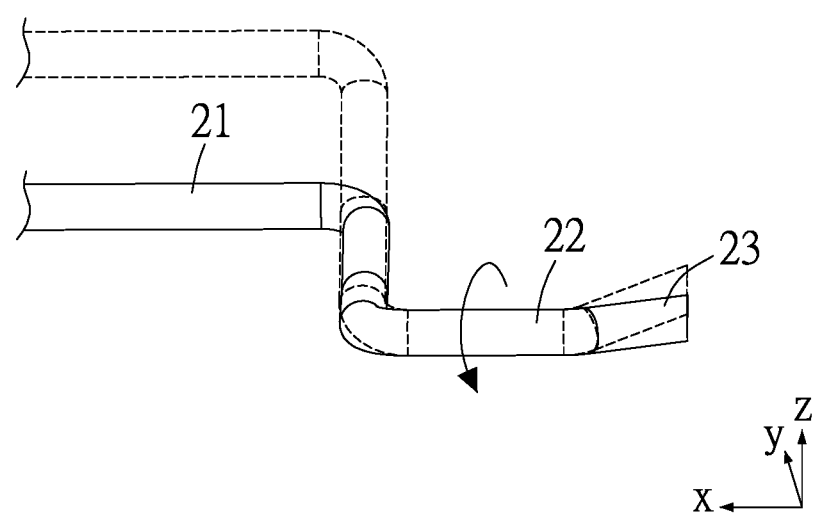
FIG. 5 shows a handle of the container of FIG. 1 changes in its position when being pivotally turned from a horizontal position to a vertical position.

As shown in FIG. 4, when the handle 2 is pulled upward manually or preferably by an automated machine, it is pivotally turned from the horizontal position as shown in FIG. 3 to a vertical position as shown in FIG. 4. At this point, the driving section 23 of the handle 2 is turned at the same time to drive the upper section 31 of the locking member 3 to move. More specifically, the turning driving section 23 pushes against the upper section 31 and causes the locking member 3 to pivotally turn from the position outside the side opening 11 toward the side opening 11. When the long bar-shaped locking member 3 is located at an exit of the side opening 11, it functions to stop objects loaded in the container main body 1 from falling off the container 200, and is particularly suitable for stop plate-shaped objects that are arranged horizontally, i.e. arranged in a plane defined by x and y axes, from falling off the container 200. The driving section 23 can be differently configured, including but not limited to a bent shape, a curved shape or any other shape capable of driving the locking member 3 to displace.

In the illustrated first embodiment, the locking member 3 is in the form of a long bar having two ends pivotally connected to the top 12 and the bottom of the container main body 1. The upper section 31 of the locking member 3 is extended in a direction parallel to the top 12. The driving section 23 is located between the upper section 31 and the top 12. The locking member 3, when being pivotally turned to the side opening 11, stops the plate-shaped objects loaded in the container main body 1 from falling off the container 200. However, it is understood the present disclosure is not particularly limited to the above configuration. The driving section 23 and the locking member 3 can be changed to other shapes or configurations and still be included in the spirit and scope of the present disclosure so long as they employ the technical skill of pivotally turning handle 2 for the driving section 23 to bring the locking member 3 to pivotally turn to the side opening 11. In an operable embodiment, the bar-shaped locking member 3 can further bring an additional device, such as a door, to move along with it at the same time, so that the door provides an increased area to close the side opening 11.

The return spring 7 is mounted to the handle 2 and received in a handle turning angle limiter 5. Preferably, the return spring 7 is located on one side of the handle 2 opposite to the driving section 23 to avoid interfering with the driving section 23. The return spring 7 enables the handle 2 to be normally flatly laid on the top 12 of the container main body 1 and brings the handle 2 to restore from a vertical position to the horizontal position when an external force pulling the handle 2 upward is released.

In brief, the locking device 100 and the container 200 using the locking device 100 according to the present disclosure are simple and compact in structure, durable for use, and easy to operate. In the present disclosure, the locking member 3 automatically closes the side opening 11 when the container 200 is lifted at the handle 2. With this design, it is able to eliminate the additional procedure of locking the container 200 and avoid objects in the container 200 from falling off during the transport of the container 200.

In the illustrated first embodiment, the locking device 100 further includes a movement limiting member located within a movement range of the upper section 31 and having a height higher than a lowest position of the upper section 31. When the handle 2 is pivotally turned from the horizontal position to the vertical position, the height of the movement limiting member is lower than the lowest position of the upper section 31, so that the locking member 3 is allowed to pivotally turn toward the side opening 11. The movement limiting member can be implemented in different configurations. While two configurations of the movement limiting member are illustrated herein, it is understood the present disclosure is not limited thereto in any way.

In the first embodiment, the movement limiting member is in the form of a guide block 4, which is fixedly mounted on the top 12 of the container main body 1 and located below the upper section 31. The guide block 4 has an apex 43, a height of which is higher than the lowest position of the upper section 31. With this configuration, the upper section 31 before being driven by the driving section 23 to pivotally turn is normally limited by the apex 43 to stay at a first side 41 of the guide block 4, as shown in FIG. 3, and prevented from pivotal turning unexpectedly. On the other hand, as shown in FIG. 4, when the handle 2 is pivotally turned from the horizontal position to the vertical position, the driving section 23 drives the upper section 31 to displace toward the side opening 11. At this point, both the guide block 4 and the upper section 31 are slightly elastically deformed, and the upper section 31 is forced to pass over the apex 43 and move to an opposite second side 42 of the guide block 4. Again, the upper section 31 is limited by the guide block 4 from passing over the apex 43 to the first side 41 and prevented from unexpectedly pivotally turning away from the side opening 11 to unlock the latter. When it is desired to unlock the locking member 3 from the side opening 11, simply restore the handle 2 from the vertical position to the horizontal position and then, pivotally turn the locking member 3 manually or preferably by an automated machine for the upper section 31 to pass over the apex 43 and return to the first side 41 of the guide block 4 again.

In the illustrated first embodiment, the guide block 4 is substantially triangular in shape and the first and the second side 41, 42 are respectively a slope, such that the guide block 4 looks like an asymmetrical obtuse triangle. However, it is understood the present disclosure is not particularly limited thereto, and the guide block 4 can be configured as any other geometrical shape, such as a curved block with the first side 41 and the second side 42 being two curved surfaces. In another embodiment, the guide block 4 may be polygonal in shape.

As shown in FIGS. 1 to 4, the locking device 100 further includes an abutting section 6 located near the first side 41 of the guide block 4. The abutting section 6 and the guide block 4 together define a limiting space S between them, and the upper section 31 is limited to be pivotally turnable only within the limiting space S. In other words, when the handle 2 is in the horizontal position as shown in FIG. 3, the upper section 31 is not only located at the first side 41 of the guide block 4, but also limited in the limiting space S by the abutting section 6, such that the locking member 3 could not be pivotally turned outward any further and is prevented from being damaged due to unexpected and excessive turning of it.

Further, the locking member 3 can be pivotally turned within a range of 135 degrees, and preferably within a range from 0 to 90 degrees. However, it is understood the present disclosure is not particularly limited thereto.

As shown in FIGS. 1 to 5, the handle 2 includes a grip section 21, a pivot section 22 and the aforesaid driving section 23, which are sequentially connected to one another. The grip section 21 is so bent that it forms a grip convenient for pulling and holding. The pivot section 22 is horizontally and pivotally connected to the top 12 of the container main body 1. The driving section 23 is located near an outer side of the container main body 1 and is connected to the pivot section 22 at a predetermined angle. Please refer to FIG. 5. When the handle 2 is turned from the horizontal position to the vertical position, the driving section 23 is synchronously moved from the position near the outer side of the container main body 1 toward a center of the container main body 1 to produce a movement vector along the x-axis, which drives the upper section 31 to pivotally turn toward the side opening 11.

As shown in FIGS. 1 to 4, the locking device 100 further includes a handle turning angle limiter 5 provided at a joint of the grip section 21 and the pivot section 22. The handle turning angle limiter 5 includes a notch 51, which is faced toward the grip section 21 to limit an angle within which the grip section 21 is allowed to pivotally turn relative to the top 12 of the container main body 1. In the illustrated first embodiment, the grip section 21 is allowed to pivotally turn relative to the top 12 in a range from 0 degree (i.e. a position horizontal with the top 12) to 120 degrees, preferably from 0 to 100 degrees, and most preferably from 0 to 90 degrees, so as to prevent the return spring 7 from fracture due to elastic fatigue. However, it is understood the present disclosure is not particularly limited thereto.

When the grip section 21 is in contact with and pressed against the handle turning angle limiter 5, the handle 2 could not be pivotally turned any further to achieve the purpose of limiting the turnable angle of the handle 2. In other operable embodiment, the handle turning angle limiter 5 may be differently configured to match different designs of the handle 2. And, the handle turning angle limiter 5 can still be differently configured or shaped even if the handle 2 is the same in its configuration. For example, the handle turning angle limiter 5 can be otherwise an abutting block provided on and protruded from the handle 2 and preferably located near the pivot section 22 or any other pivotally turnable position. When the abutting block is turned to press against the top 12 of the container main body 1, the handle 2 is limited from turning any further.

In FIGS. 6 to 10, there is shown a locking device and container using the same according to a second embodiment of the present disclosure. The second embodiment is different from the first one in that the locking device 100 in the second embodiment includes a movement limiting member in the form of a protruded section 24 provided on the handle 2.

The protruded section 24 is located within a movement range of the upper section 31 and is protruded from the pivot section 22 or the driving section 23. The protruded section 24 and the guide block 4 are the same in terms of their basic function, i.e. both of them are configured to prevent the locking member 3 from moving arbitrarily.

Figure 6:
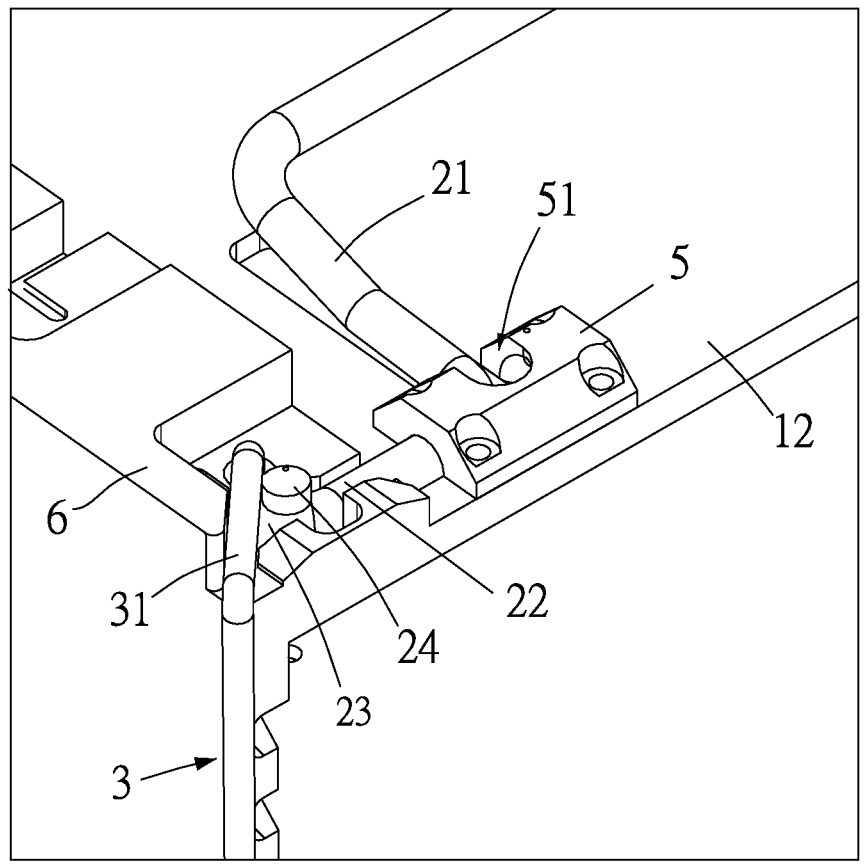
FIG. 6 is a partial enlarged view of a container using a locking device according to a second embodiment of the present disclosure.
Figure 7:
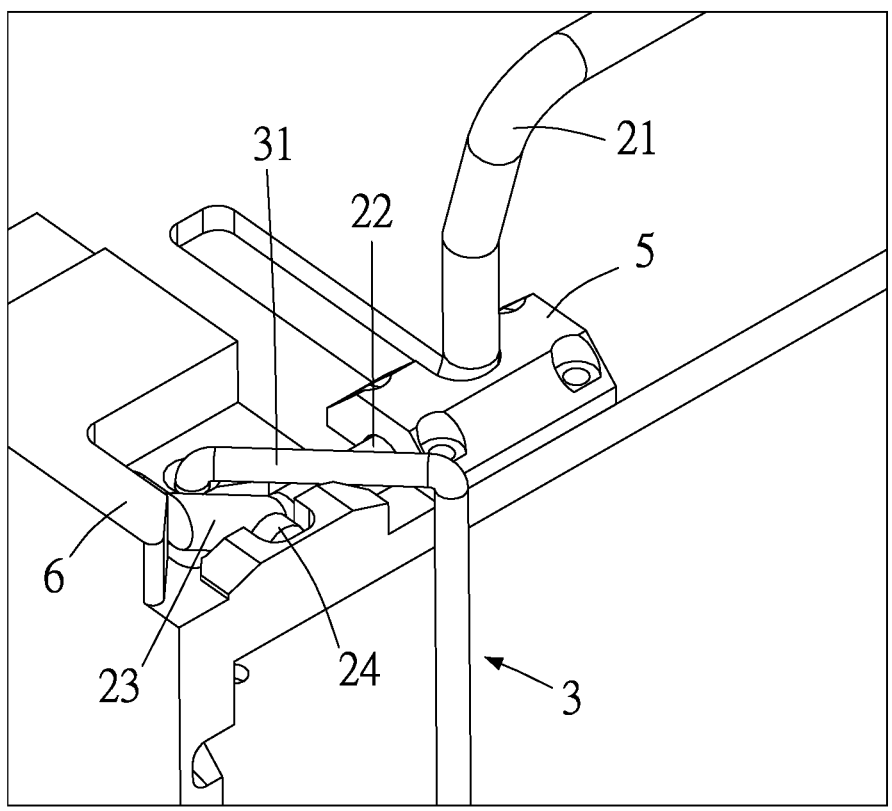
FIG. 7 is a partial enlarged view of the container of FIG. 6 with a handle of the container being pivotally turned from a horizontal position to a vertical position.

As shown in FIG. 6, when the handle 2 is located in the horizontal position, the protruded section 24 is located at a height position higher than the lowest position of the upper section 31 to prevent the locking member 3 from turning unexpectedly. As shown in FIG. 7, when the handle 2 is pivotally turned from the horizontal position to the vertical position, the protruded section 24 is brought to turn into another height position lower than the lowest position of the upper section 31, such that the upper section 31 can be driven by the driving section 23 toward the side opening 11.

Figure 8:
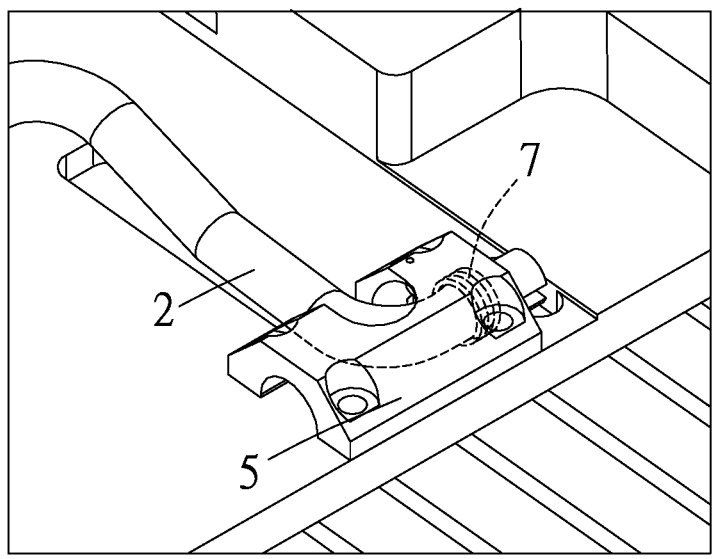
FIG. 8 is another partial enlarged view of the container using a locking device according to a second embodiment of the present disclosure.

As shown in FIG. 8, the locking device 100 in the second embodiment also includes a return spring 7, which is provided at one side of the handle 2 opposite to the locking member 3 for normally pushing the handle 2 to the horizontal position on the top 12 and allowing the handle 2 to restore from the vertical position to the horizontal position when an external force pulling the handle 2 upward is released.

Figure 9:
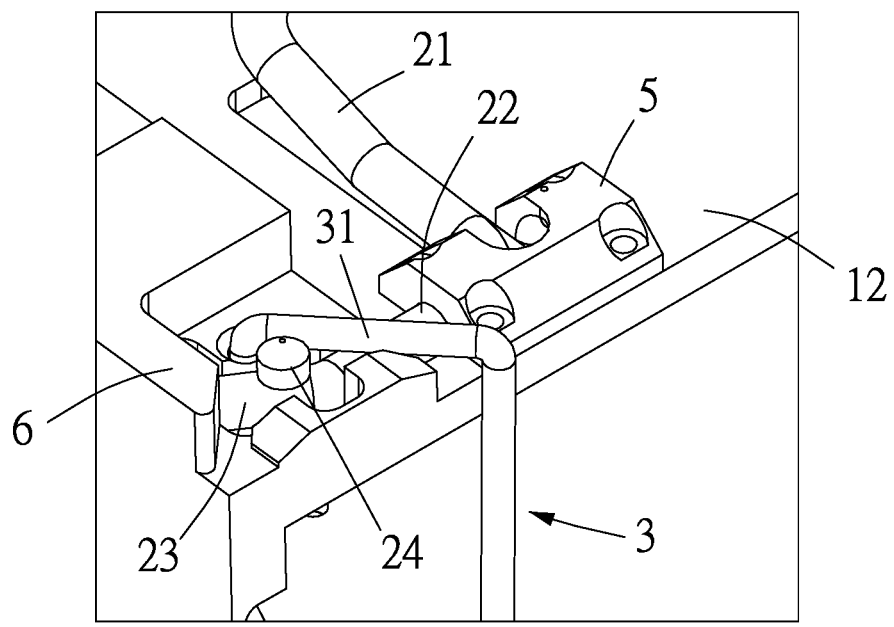
FIG. 9 shows the locking device according to the second embodiment of the present disclosure is held to a locked position.

As shown in FIG. 9, an elastic potential energy stored in the return spring 7 immediately restores the handle 2 to the horizontal position as soon as the external force pulling the handle 2 upward is released. It is noted the restoration of the handle 2 to the horizontal position does not bring the locking member 3 to pivotally turn, this is because the protruded section 24 also turns along with the handle 2 to return to the height position higher than the lowest position of the upper section 31 and functions to limit the locking member 3 from pivotally turning outward away from the side opening 11 and unexpectedly unlocking the side opening 11. To unlock the side opening 11 locked by the locking member 3, first turn the handle 2 to the vertical position and then push the locking member 3 outward manually or with an automated machine for the locking member 3 to pivotally turn outward and unlock the side opening 11.

Figure 10:
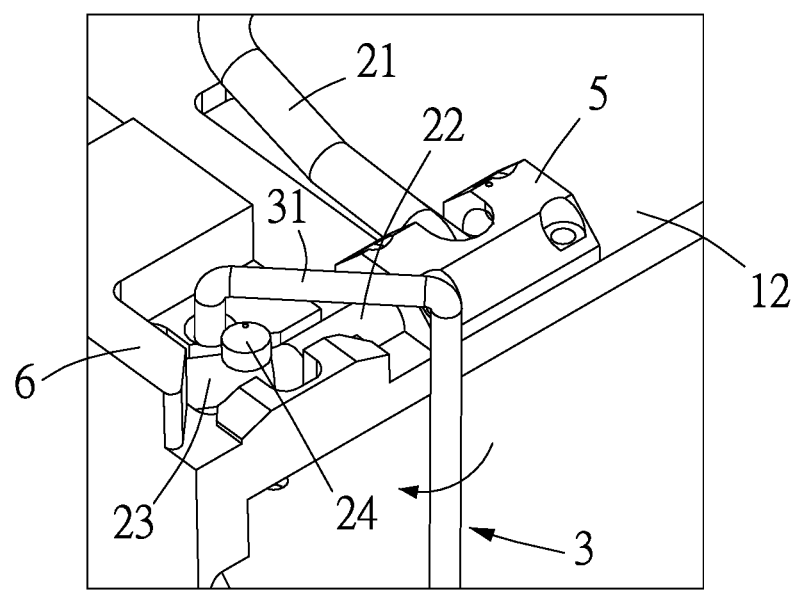
FIG. 10 shows the manner of unlocking the locking device according to the second embodiment of the present disclosure.

Or, as shown in FIG. 10, the locking member 3 may have an overall length larger than a largest height of the container main body 1 and have two hook-shaped ends for hooking to the top 12 and the bottom of the container main body 1. Under the gravity, the upper section 31 of the locking member 3 is normally pressed against the top 12, while the other end of the locking member 3 is located at a distance from the bottom of the container main body 1. Thus, an upward force can be applied to the other end of the locking member 3 to move or pull the upper section 31 upward for the lowest position of the locking member 3 to be temporarily located higher than the protruded section 24, so that the locking member 3 can be pivotally turned outward to unlock the side opening 11.

While the present disclosure has been described by means of specific embodiments, numerous modifications and variations could be made thereto by those skilled in the art without departing from the scope and spirit of the present disclosure set forth in the claims.

What is claimed is:

1. A locking device being provided adjacent to a side opening of a container main body, comprising:
    a handle being pivotally mounted to a top of the container main body and turnable between a horizontal position and a vertical position relative to the top; and the handle including a driving section;
    a locking member being in the form of a long bar and having two opposite ends pivotally connected to the top and a bottom of the container main body, such that the locking member is turnable toward or away from the side opening; and the locking member including an upper section located adjacent to the driving section;
    a return spring being mounted to the handle; and
    a movement limiting member located within a movement range of the upper section and having a height higher than a lowest position of the upper section,
    wherein when the handle is pivotally turned from the horizontal position to the vertical position, the driving section is turned at the same time to drive the upper section for the locking member to pivotally turn toward the side opening, and
    wherein the height of the movement limiting member is lower than the lowest position of the upper section to allow the locking member to pivotally turn toward the side opening when the handle is pivotally turned from the horizontal position to the vertical position.

2. The locking device according to claim 1, wherein the upper section of the long bar-shaped locking member is extended in a direction parallel to the top of the container main body, and the driving section being located between the upper end and the top of the container main body.

3. The locking device according to claim 1, wherein the movement limiting member is a protruded section provided on the handle and located within a movement range of the upper section; the protruded section being located at a height position higher than the lowest position of the upper section when the handle is located in the horizontal position; and the protruded section being located at another height position lower than the lowest position of the upper section to allow the locking member to pivotally turn toward the side opening when the handle is pivotally turned from the horizontal position to the vertical position.

4. The locking device according to claim 1, further comprising a handle turning angle limiter provided on the handle; and the handle turning angle limiter limiting the handle to pivotally turn relative to the top of the container main body within a range from zero to 120 degrees.

5. The locking device according to claim 1, wherein the handle includes a grip section, a pivot section and the driving section, which are sequentially connected to one another; the pivot section being horizontally and pivotally connected to the top of the container main body, and the driving section being located near an outer side of the container main body and connected to the pivot section at a predetermined angle; and the driving section being moved from the position near the outer side of the container main body toward the side opening when the handle is pivotally turned from the horizontal position to the vertical position.

6. The locking device according to claim 5, further comprising a handle turning angle limiter provided at a joint of the grip section and the pivot section; and the handle turning angle limiter being provided with a notch facing toward the grip section to limit an angle within which the grip section is allowed to pivotally turn relative to the top of the container main body.

7. A container, comprising:
    a container main body having at least one side opening; and
    a locking device according to claim 1.

8. The locking device according to claim 1, wherein the return spring is configured to keep the handle at the horizontal position.

* * * * *